United States Patent [19]

Bazes

[11] Patent Number: 5,442,310
[45] Date of Patent: Aug. 15, 1995

[54] CIRCUITRY AND METHOD FOR RESET DISCRIMINATION

[75] Inventor: Mel Bazes, Haifa, Israel

[73] Assignee: Intel Corporation, Santa Clara, Calif.

[21] Appl. No.: 284,930

[22] Filed: Aug. 2, 1994

Related U.S. Application Data

[63] Continuation of Ser. No. 923,076, Jul. 31, 1992, abandoned.

[51] Int. Cl.⁶ ............................................. H03K 17/22
[52] U.S. Cl. ..................................... 327/143; 327/34; 327/160; 327/198
[58] Field of Search ..................... 327/31, 34, 35, 142, 327/143, 154, 155, 160, 339, 198

[56] References Cited

U.S. PATENT DOCUMENTS

| | | | |
|---|---|---|---|
| 3,828,258 | 8/1974 | Hills et al. | 327/33 |
| 3,835,336 | 9/1974 | Block | 327/31 |
| 3,980,960 | 9/1976 | Hutchinson | 327/31 |
| 4,288,831 | 9/1981 | Dolikian | 327/31 |
| 4,675,545 | 6/1987 | Takahashi | 327/172 |
| 4,692,710 | 9/1987 | Shvartsman | 327/26 |
| 4,710,721 | 12/1987 | Camus | 327/31 |
| 4,900,950 | 2/1990 | Dubujet | 327/143 |
| 4,926,072 | 5/1990 | Hyodo | 327/34 |
| 5,159,217 | 10/1992 | Mortensen et al. | 327/143 |

*Primary Examiner*—Timothy P. Callahan
*Assistant Examiner*—Terry D. Cunningham
*Attorney, Agent, or Firm*—Blakely, Sokoloff, Taylor & Zafman

[57] ABSTRACT

A reset discrimination circuit for identifying the completion of power-up via a valid deassertion of an external reset signal is described. When power-up is complete the reset discrimination circuit brings a function enable signal active, which initially powered up in the inactive state. The reset discrimination circuit includes a synchronous edge detector, a high counter, and a low counter. The synchronous edge detector detects the active state of the external reset signal and generates a first reset signal, which resets the high counter. After counting M clock pulses during the active state of the external reset signal the first counter enables the low counter. The low counter counts N clock pulses during the inactive state of the external reset signal to identify its valid deassertion. A method of identifying the completion of power-up by identifying the valid deassertion of an external reset signal is also described.

7 Claims, 4 Drawing Sheets

FIG_4

FIG_5

CIRCUITRY AND METHOD FOR RESET DISCRIMINATION

This is a continuation of application Ser. No. 07/923,076, filed Jul. 31, 1992 now abandoned.

FIELD OF THE INVENTION

The present invention relates to a circuit and method for bringing a signal up and holding it in known state until the completion of power-up. More particularly, the present invention pertains to a circuit and method for performing reset discrimination to determine the completion of power-up.

BACKGROUND OF THE INVENTION

A number of problems are presented when requiring an output signal to come up in a known state during power-up and remain in that state until power-up is complete. First, an external reset signal cannot be relied upon to bring the output signal up in a known state. The external reset signal may not become active until well after power-up has started. Furthermore, the external reset signal may not behave predictably during power-up. The second problem presented by such a requirement is that prior circuits cannot be depended upon to respond appropriately to the external reset signal during power-up, even if the external reset signal became active at the start of power-up and behaved predictably. Finally, an additional problem posed by such a requirement is that the completion of power-up cannot be accurately determined simply by observing Vcc.

Analog circuitry does not offer an acceptable solution to such a requirement because it must be tuned. Tuning implies stepping one or more production masks or reticles with the accompanying schedule delays.

SUMMARY OF THE INVENTION

A reset discrimination circuit for identifying the completion of power-up via a valid deassertion of a external reset signal is described. When power-up is complete the reset discrimination circuit brings a function enable signal active, which initially powered up inactive. The reset discrimination circuit includes a synchronous edge detector, a high counter, and a low counter. The synchronous edge detector detects the active state of the external reset signal and generates a first reset signal to reset the high counter. After counting M clock pulses during the active state of the external reset signal the high counter enables the low counter. The low counter counts N clock pulses during the inactive state of the external reset signal to identify its valid deassertion. After counting N clock pulses during the inactive state of the external reset signal, the low counter brings the function enable signal active.

An advantage of reset discrimination circuit is that since it is implemented with digital circuitry it operates the first time, without tuning.

A method of identifying the completion of power-up by identifying the valid deassertion of an external reset signal is also described. Identification begins by resetting a first counter and a second count counter when a positive supply voltage reaches a MOS threshold voltage. When the external reset counter goes active the first counter begins counting. Once the first counter reaches its terminal count, the second counter is enabled. This allows the second counter to count while the external reset signal is inactive. If the external reset signal returns active before the low counter reaches its terminal count the deassertion of the external reset was spurious. Consequently, both the high counter and low counter are reset. Once the low counter reaches its terminal count, a valid deassertion of the external reset signal has occurred. This is signalled by forcing a function enable signal active from the inactive state it powered up in.

Also described is a master-slave flip-flop that powers up in a known state. A master stage generates a first output and a second output, which are complementary. A first capacitive device forces the first output to a first voltage level during power-up. Analogously, a second capacitive device forces the second output to a second voltage level during power-up. A slave stage generates a third output and a fourth output, which are complementary. A third capacitive device forces the third output to the first voltage level during power-up. The fourth output is pulled to the second voltage during power-up by a fourth capacitive device.

Other objects, features, and advantages of the present invention will be apparent from the accompanying drawings and the detailed description that follows.

BRIEF DESCRIPTION OF THE FIGURES

The present invention is illustrated byway of example and not limitation in the figures of the accompanying drawings in which references indicate similar elements and in which:

FIG. 2 is a flow chart of the operation of the reset discrimination circuit.

FIG. 6 is a schematic diagram of a falling-edge-triggered D flip-flop that powers up in a known state.

DETAILED DESCRIPTION

Figure 1:
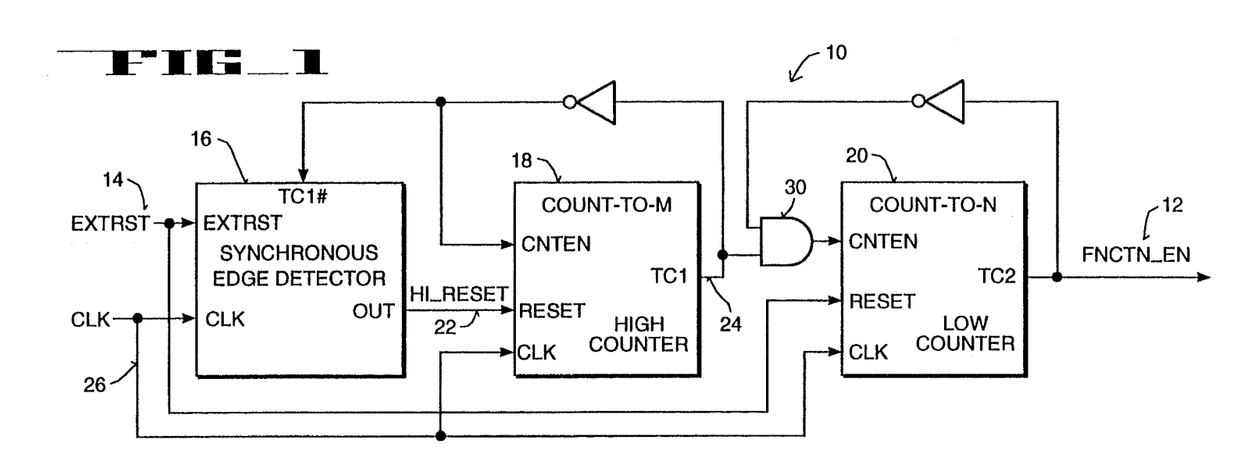
FIG. 1 is a block diagram of a reset discrimination circuit.

FIG. 1 illustrates in block diagram form reset discrimination circuit 10 of the present invention. Reset discrimination circuit 10 generates a function enable signal, FNCTN_EN 12, that remains inactive from the beginning of power-up until power-up is complete. Thus, FNCTN_EN 12 identifies the completion of power-up.

Reset discrimination circuit 10 identifies the completion of power-up by performing pattern recognition on an external reset signal, EXTRST 14. This permits reset discrimination circuit 10 to accurately identify the completion of power-up even in the face of unpredictable power-up behavior by EXTRST 14. Reset discrimination circuit 10 recognizes the completion of power up when a valid active state of EXTRST 14 is followed by a valid inactive state. A valid active state, unlike a spurious active state, meets or exceeds a minimum active duration. A valid inactive state is similarly distinguished from a spurious inactive state by meeting or exceeding a minimum inactive duration.

Identification of the completion of power-up begins with synchronous edge detector 16, which resets high counter 18 via HI_RESET 22. HI_RESET 22 goes active high for a single clock period when EXTRST 14 returns to its active state.

High counter 18 responds to the inactive state of HI_RESET 22 by beginning to count pulses of CLK 26. High counter 18 identifies the active state of EXTRST 14 by counting M CLK 26 pulses during a single active state of EXTRST 14. Its maximum count reached, high counter 18 brings it terminal count signal, TC1 24 active, thereby enabling low counter 20.

Low counter 20 does not begin counting, however, until EXTRST 14 goes inactive. Low counter 20 then identifies the valid deassertion of EXTRST 14 by counting N clocks during the inactive state of EXTRST 14. When its terminal count is reached, low counter 20 signals the completion of power-up by bringing FNCTN_EN 12 active.

The flow chart of FIG. 2 explains the operation of reset discrimination circuit 10 in greater detail. Operation of reset discrimination circuit 10 begins in state 40 as the positive D.C. voltage level, Vcc, starts to rise from ground. Once Vcc exceeds a minimum level, high counter 18 and low counter 20 are forced to known states by the special flip-flops with which they are designed. These flip-flops will be described in detail later. As a result, both TC1 24 and FNCTN_EN 12 are forced to their inactive low states irrespective of the states of EXTRST 14 or CLK 26.

HI_RESET 22 holds TC1 24 inactive low until EXTRST 14 goes active high. After EXTRST 14 goes high, synchronous edge detector 16 forces HI_RESET 22 inactive. High counter 18 is then free to increment its count when clock signal, CLK 26, pulses active. This series of events is illustrated by states 44, 48, and 50.

As long as EXTRST 14 is active high, high counter 18 increments its count. If EXTRST 14 falls inactive low before high counter 18 reaches its full count, M, then high counter 18 will be cleared by synchronous edge detector 16. This is shown by the branch from state 44 to state 46. Thus, on the next occasion EXTRST 14 becomes active high counter 18 begins counting from zero. Once high counter 18 reaches its full count, TC1 24 goes active. This is shown by the branch from state 50 to state 52.

Active TC1 24 has two effects upon reset discrimination circuit 10. First, active TC1 24 prevents high counter 18 from incrementing its count further. TC1 24 is inverted and fed back to the count enable input of high counter 18. Thus, active TC1 24 disables high counter 18. Second, active TC1 24 enables low counter 20, provided FNCTN_EN 12 is inactive. TC1 24 is combined with an inverted version of FNCTN_EN 12 by AND gate 30. The output of AND gate 30 is applied to the count enable input of low counter 20.

The active-to-inactive transition of TC1 24 transfers pattern recognition duties from high counter 18 to low counter 20. With the active portion of EXTRST 14 verified, low counter 20 now attempts to verify the inactive portion. Low counter 20 begins this task once EXTRST 14 goes inactive, permitting the outputs of low counter 20 to change state. This is shown by the branch from state 52 to state 54. During state 54 low counter 20 increments its count in response to CLK 26 pulses.

Low counter 20 continues to increment for as long as EXTRST 14 is inactive low. Should EXTRST 14 return active high before low counter 20 reaches its terminal count then power-up is not complete and the inactive state of EXTRST 14 was spurious. As a result, evaluation of EXTRST 14 must begin again with verification by high counter 18. In response to active EXTRST 14, both low counter 20 and high counter 18 are reset, as shown by the transitions through states 56, 58, 60, and 46. Low counter 20 is reset directly by EXTRST 14. High counter 18 is reset by a one-clock pulse via HI_RESET 22. Afterward, high counter 18 attempts to verify the active state of EXTRST 14 as described previously with respect to states 44, 48, and 50.

Eventually during power-up the erratic behavior of EXTRST 14 ceases and low counter 20 increments its count to its maximum, N. In response, FNCTN_EN 12 goes active high, signalling the completion of power-up. This is shown by the branch from state 56 to state 62. Via feedback to the count enable input, FNCTN_EN 12 remains active; high as long as EXTRST 14 is inactive.

Figure 3:
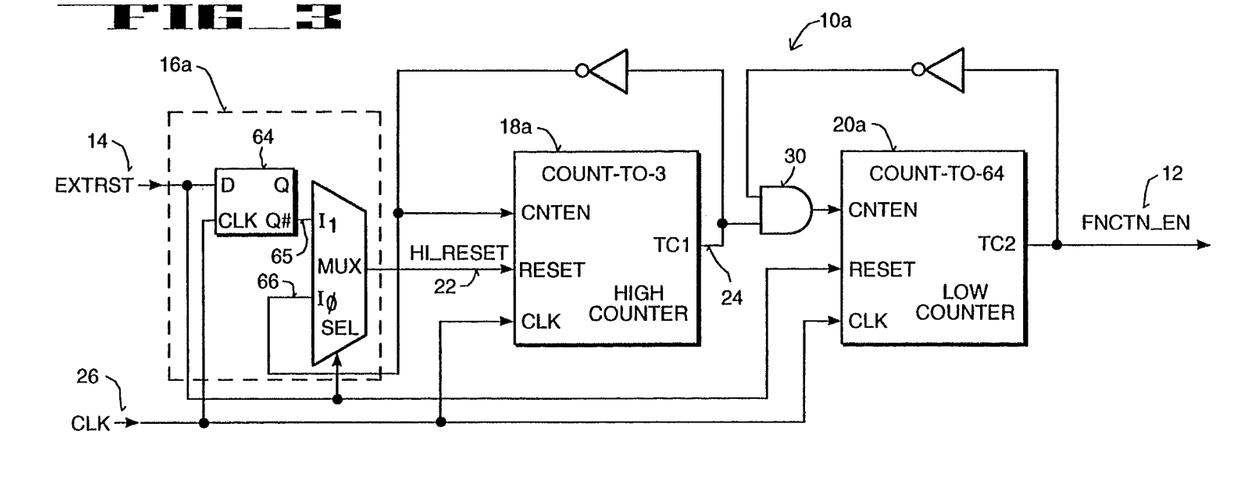
FIG. 3 is a more detailed block diagram of the reset discrimination circuit.

FIG. 3 illustrates embodiment 10a of reset discrimination circuit 10. Reset discrimination circuit 10a further defines three features: synchronous edge detector 16, the full count, M, of high counter 18, and the full count, N, of low counter 20.

Synchronous edge detector 16a includes D flip-flop 64 and multiplexer 66. Synchronous edge detector 16a ensures that high counter 18a remains reset once Vcc rises above the MOS threshold, regardless of the states of EXTRST 14 and CLK 26 during power up. In other words, both multiplexer inputs 10 and I1 are forced to an active state when Vcc rises above the MOS threshold. The I1 input is coupled to Q# output of D flip-flop 64, which is forced to Vcc during power-up. The 10 input is coupled to an inverted version of TC1 24, which is forced to ground during power-up.

Synchronous edge detector 16a holds high counter 18a reset for a single clock cycle when EXTRST 14 goes active high. When it goes high, EXTRST 14 selects I1 to be output as HI_RESET 22. I1 remains active high until the clock cycle after EXTRST 14 goes active. D flip-flop 64 then forces Q# output 65 from a logic 1 to a logic 0. As a result, HI_RESET 22 goes inactive, allowing high counter 18a to begin incrementing its count.

Synchronous edge detector 16a resets high counter 18a if EXTRST 14 falls inactive before high counter 18 reaches it terminal count. The active-to-inactive transition of EXTRST 14 selects 10 as HI_RESET 22. As TC1 24 is inactive, 10 is active high. Thus, the active-to-inactive transition of EXTRST 14 resets high counter 18a.

Once high counter 18a reaches its terminal count HI_RESET 22 remains inactive until EXTRST 14 returns active. The active-to-inactive transition of EXTRST 14 in this situation changes the input selected as HI_RESET 22, without changing its state. Because TC1 24 is active, 10 is inactive, as is I1.

The maximum count, M, of high counter 18a should be set to nearly the minimum number of clock cycles that EXTRST 14 is specified to be active high. In reset discrimination circuit 10a, M is set to three because four is the specified minimum number of clock cycles that EXTRST 14 is active high prior to its valid deassertion. Should a larger number be specified for the minimum number of clocks that EXTRST 14 is active before deassertion, a larger value for M would be chosen. In general, the larger M, without exceeding the specified number of clocks, the more reliably reset discrimination circuit 10a discriminates between a valid active EXTRST 14 and a spurious, or invalid, active EXTRST 14.

The maximum count, N, of low counter 20 is set in consideration of the minimum number clock cycles after EXTRST 14 goes inactive by which the system relying upon FNCTN_EN 12 must be active. For example, if the system must be active within 120-130 clock cycles after EXTRST 14 goes inactive, then N should be set to a large number, such as 50, 64, 100, or some number under 120. The larger the number N is set to the more reliably valid completion of power-up is identified. Clearly, the response time of the system will set an upper limit on the value chosen for N.

Figure 4:
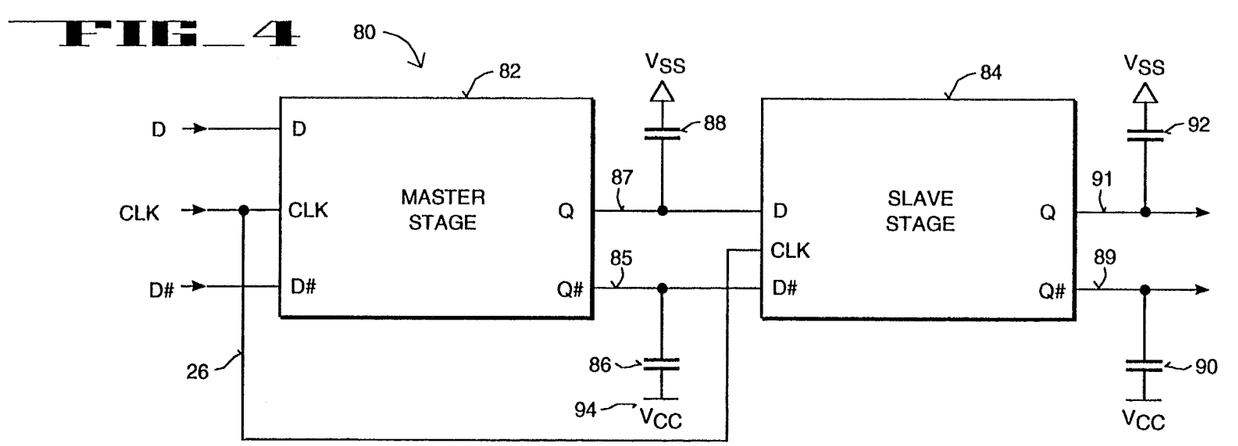
FIG. 4 is a block diagram of a D flip-flop that powers up in a known state.

FIG. 4 illustrates in block diagram form D flip-flop 80, which is used in the construction of synchronous edge detector 16, high counter 18, and low counter 20. D flip-flop 80 powers up in a known state, thus permitting reset discrimination circuit 10 and FNCTN_EN 12 to do the same irrespective of the states of EXTRST 14 and CLK 26.

Flip-flop 80 includes master stage 82, slave stage 84, and-four capacitors 86, 88, 90, and 92. Upon power-up,, capacitor 86 pulls Q# output 85 of master stage 82 to Vcc. Capacitior 86 is able to do so because it is coupled between Vcc and output 85. Coupled between ground and Q output 87 of master stage 82, capacitor 88 pulls Q output 87 to Vss upon power-up. Capacitors 90 and 92 perform identical functions for slave stage 84. Capacitor 90 pulls Q# output 89 up to Vcc upon power-up, while capacitor 92 pulls Q output 91 to Vss; i.e. ground.

The action of capacitors 86, 88, 90, and 92 results from the dynamic behavior of Vcc during power-up. Capacitors 86, 88, 90, and 92 couple changes in the voltage difference between Vcc and Vss to the flip-flop nodes. Once Vcc stabilizes, capacitors 86, 88, 90, and 92 no longer influence the flip-flop state. However, they do represent constant capacitive loads on the flip-flop nodes that slow down the flip-flop's transition time.

Figure 5:
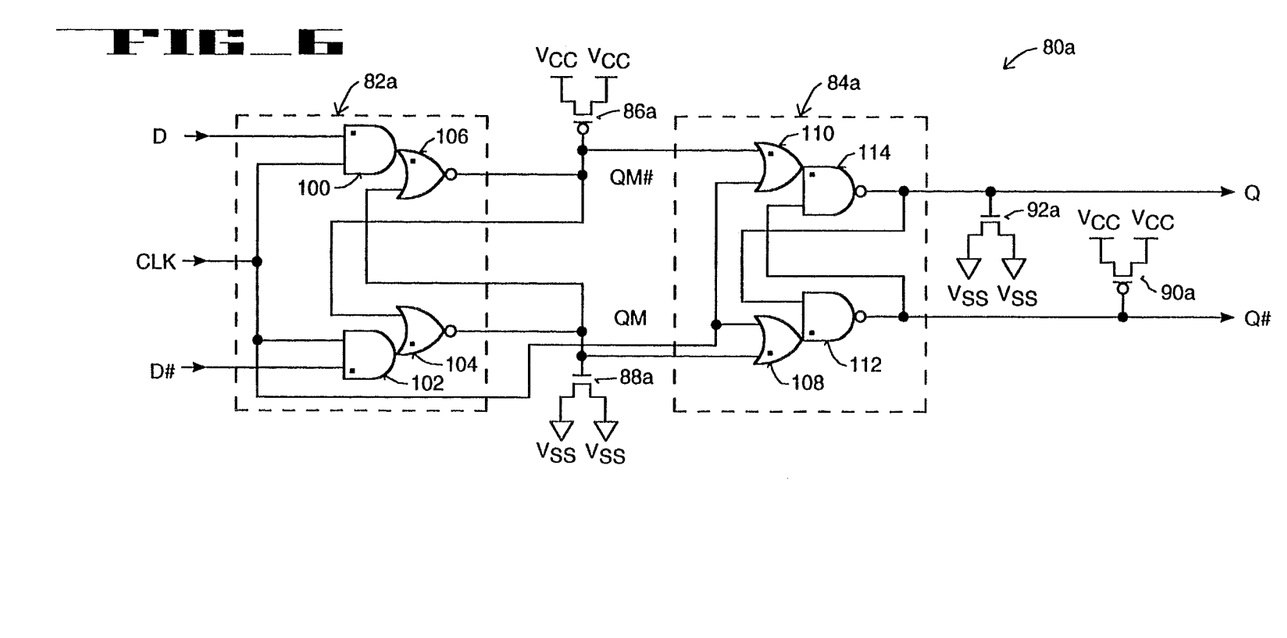
FIG. 5 is a graph of the response of the D flip-flop to Vcc.

FIG. 5 illustrates the response of Q outputs 87 and 91 and Q# outputs 85 and 89 as Vcc 94 increases during power-up. Once Vcc 94 reaches approximately the MOS threshold voltage, approximately 0.7 volts in contemporary MOS technology, Q# outputs 89 and 85 follow Vcc 94. Q outputs 87 and 91 settle at about 0.0 volts. The regenerative action of the flip-flop 80 amplifies the slight voltage difference caused by capacitors 86, 88, 90 and 92 into a full Vcc–Vss difference.

To ensure symmetrical behavior of Q outputs 87 and 91 and Q# outputs 85 and 89 the values of capacitors 86, 88, 90, and 92 should be the same and not so great as to unnecessarily delay the response of D flip-flop 80.

FIG. 6 illustrates falling edge triggered, master-slave D flip-flop 80a, which powers up to known states. FIG. 6 further defines three features of D flip-flop 80. First, capacitors 86, 88, 90, and 92 are realized using MOS transistors. Capacitors 86a and 90a are both PMOS transistors. The drain and source of both transistors 86a and 90a are coupled to Vcc. In contrast, capacitors 88a and 92a are both NMOS transistors whose drains and sources are coupled to Vss.

The second feature further defined is master stage 82a. Master stage 82a includes two AND gates 100 and 102 and two cross coupled NOR gates 104 and 106. AND gates 100 and 102 are both coupled to CLK and to one of the two complementary inputs, D and D#. The output of each AND gate 100 and 102 is coupled to the input of one of NOR gates 104 and 106.

Slave stage 84a is the third feature further defined by D flip-flop 80a. Slave stage 84a includes two OR gates 108 and 110 and two cross coupled NAND gates 112 and 114. OR gates 108 and 110 are both coupled to CLK and to one of the two complementary outputs of master stage 82a. The output of each OR gate 108 and 110 is coupled to the input of one of NAND gates 112 and 114.

The D flip flops used to realize synchronous edge detector 16, high counter 18 and low counter 20 can also be rising edge triggered. A rising edge triggered flip-flop can be designed by using slave stage 84a as a master stage and using master stage 82a as a slave stage.

Thus, a method and circuitry for bringing a signal up in a known state and maintaining that state until power-up is complete has been described. A D flip-flop that powers up in a known state has also been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of identifying an inactive state of an external reset signal, the external reset signal having an active state preceding the inactive state, the method comprising the steps of:
   a) resetting a first count generated by a first counter and a second count generated by a second counter, both counts being reset when a positive supply voltage reaches a MOS threshold voltage;
   b) determining whether the external reset signal is in the active state;
   c) resetting the first counter if the external reset signal is not in the active state;
   d) incrementing a first count of the first counter if the external reset signal is in the active state;
   e) repeating steps b)–d) if the first count is not equal to a first number;
   f) determining whether the external reset signal is in the inactive state if the first count is equal to the first number;
   g) resetting the second counter if the external reset signal is not in the inactive state;
   h) incrementing the second count if the external reset signal is in the inactive state;
   i) comparing the second count to a second number
   j) if the second count is less than the second number;
      1) repeating steps h) through j) if the external reset signal remains in the inactive state;
      2) resetting both counters and repeating steps d) through j) if the external reset signal is in the active state; and
   k) bringing a function enable signal from an inactive state to an active state if the second count is equal to the second number.

2. A reset discrimination circuit identifying completion of power up upon a valid inactive state of an external reset signal, and signaling completion of power up via an active state of a function enable signal, comprising:
   a first counter, having a clock input coupled to a clock signal including a multiplicity of clock pulses and having a reset input coupled to the external reset signal, for identifying a valid active state of the external reset signal, the first counter generating a first terminal count signal and bringing it to an active state after counting a first number of clock pulses during an active state of the external reset signal;

a first inversion device having an input coupled to the first terminal count signal and having an output coupled to a count enable input of the first counter; and, a second counter, having a count enable input coupled to the first terminal count signal and a clock input coupled to the clock signal, for identifying the valid inactive state of the external reset signal following the valid active state of the external reset signal, the second counter being enabled to begin counting a second number of clock pulses by the active state of the first terminal count signal, the second counter generating the function enable signal, bringing it to an inactive state during power up and holding it in the inactive state until the second counter counts the second number of clock pulses during the inactive state of the external reset signal.

3. A reset discrimination circuit identifying completion of power up upon a valid inactive state of an external reset signal, and signaling completion of power up via an active state of a function enable signal, comprising:

a first counter, having a clock input coupled to a clock signal including a multiplicity of clock pulses and having a reset input coupled to the external reset signal, for identifying a valid active state of the external reset signal, the first counter generating a first terminal count signal and bringing it to an active state after counting a first number of clock pulses during an active state of the external reset signal; and, a second counter, having a count enable input coupled to the first terminal count signal, a clock input coupled to the clock signal, and a multiplicity of flip-flops powering up to known states such that the function enable signal powers up in the inactive state, for identifying the valid inactive state of the external reset signal following the valid active state of the external reset signal, the second counter being enabled to begin counting a second number of clock pulses by the active state of the first terminal count signal, the second counter generating the function enable signal, bringing it to an inactive state during power up and holding it in the inactive state-until the second counter counts the second number of clock pulses during the inactive: state of the external reset signal.

4. A reset discrimination circuit identifying completion of power up upon a valid inactive state of an external reset signal, and signaling completion of power up via an active state of a function enable signal, comprising:

a first counter, having a clock input coupled to a clock signal including a multiplicity of clock pulses and having a reset input coupled to the external reset signal, for identifying a valid active state of the external reset signal, the first counter generating a first terminal count signal and bringing it to an active state after counting a first number of clock pulses during an active state of the external reset signal;

a synchronous edge detector, having an input coupled to the external reset signal, for detecting an active state of the external reset signal and generating a first reset signal having a duration less than the duration of the valid active state of the external reset signal, the first reset signal being coupled to the reset input of the first counter, the synchronous edge detector comprising:

a flip-flop having an input coupled to the external reset signal and generating a Q# output;

a multiplexor, having a first input coupled to a complement of the first terminal count signal and a second input coupled to the Q# output, for generating the first reset signal, the multiplexor selecting the complement of the first terminal count signal as the first reset signal when the external reset signal is low and the Q# output as the first reset signal when the external reset signal is high; and, a second counter, having a count enable input coupled to the first terminal count signal and a clock input coupled to the clock signal, for identifying the valid inactive state of the external reset signal following the valid active state of the external reset signal, the second counter being enabled to begin counting a second number of clock pulses by the active state of the first terminal count signal, the second counter generating the function enable signal, bringing it to an inactive state during power up and holding it in the inactive state until the second counter counts the second number of clock-pulses during the inactive state of the external reset signal.

5. A reset discrimination circuit identifying completion of power up upon a valid inactive state of an external reset signal, and signaling completion of power up via an active state of a function enable signal, comprising:

a first counter, having a clock input coupled to a clock signal including a multiplicity of clock pulses and having a reset input coupled to the external reset signal, for identifying a valid active state of the external reset signal, the first counter generating a first terminal count signal and bringing it to an active state after counting a first number of clock pulses during an active state of the external reset signal;

an AND device having a first input coupled to the first terminal count signal and an output coupled to a count enable input of a second counter;

a first inversion device having an input coupled to the function enable signal and an output coupled to a second input of the AND device; and, the second counter, having a count enable input coupled to the first terminal count signal and a clock input coupled to the clock signal, for identifying the valid inactive state of the external reset signal following the valid active state of the external reset signal, the second counter being enabled to begin counting a second number of clock pulses by the active state of the first terminal count signal, the second counter generating the function enable signal, bringing it to an inactive state during power up and holding it in the inactive state until the second counter counts the second number of clock pulses during the inactive state of the external reset signal.

6. A reset discrimination circuit identifying completion of power up upon a valid inactive state of an external reset signal, and signaling completion of power up via an active state of a function enable signal, comprising:

a first counter, having a clock input coupled to a clock signal including a multiplicity of clock pulses and having a reset input coupled to the external reset signal, for identifying a valid active state of the external reset signal, the first counter generating a first terminal count signal and bringing it to an active state after counting a first number of clock pulses during an active state of the external reset signal; and, a second counter, having a count enable input coupled to the first terminal count signal and a clock input coupled to the clock signal, for identifying the valid inactive state of the external reset signal following the valid active state of the external reset signal, the second counter being enabled to begin counting a second number of clock pulses by the active state of the first terminal count signal, the second counter generating the function enable signal, bringing it to an inactive state during power up and holding it in the inactive state until the second counter counts the second number of clock pulses during the inactive state of the external reset signal, the second number being larger than the first number.

7. A reset discrimination circuit identifying completion of power up upon a valid inactive state of an external reset signal, and signaling completion of power up via an active state of a function enable signal, comprising:

a first counter, having a clock input coupled to a clock signal including a multiplicity of clock pulses and having a reset input coupled to the external reset signal, for identifying a valid active state of the external reset signal, the first counter generating a first terminal count signal and bringing it to an active state after counting a first number of clock pulses during an active state of the external reset signal; and, a second counter, having a count enable input coupled to the first terminal count signal and a clock input coupled to the clock signal, for identifying the valid inactive state of the external reset signal following the valid active state of the external reset signal, the second counter being enabled to begin counting a second number of clock pulses by the active state of the first terminal count signal, the second counter generating the function enable signal, bringing it to an inactive state during power up and holding it in the inactive state until the second counter counts the second number of clock pulses during the inactive state of the external reset signal, the second number being smaller than the first number.

* * * * *

UNITED STATES PATENT AND TRADEMARK OFFICE
CERTIFICATE OF CORRECTION

PATENT NO. : 5,442,310
DATED : August 15, 1995
INVENTOR(S) : Mel Bazes It is certified that error appears in the above-identified patent and that said Letters Patent is hereby corrected as shown below:

In column 2 at lines 59-60 delete "spudous" and insert --spurious--

Signed and Sealed this

Fifteenth Day of July, 1997

*Attest:*

BRUCE LEHMAN

*Attesting Officer*  *Commissioner of Patents and Trademarks*